(12) United States Patent
Den Hartog et al.

(10) Patent No.: US 10,079,595 B1
(45) Date of Patent: Sep. 18, 2018

(54) BIDIRECTIONAL INTERFACE USING THIN OXIDE DEVICES

(71) Applicant: International Business Machines Corporation, Armonk, NY (US)

(72) Inventors: Brent R. Den Hartog, Rochester, MN (US); Eric J. Lukes, Stewartville, MN (US); Matthew J. Paschal, Rochester, MN (US); Nghia V. Phan, Rochester, MN (US); Raymond A. Richetta, Rochester, MN (US); Patrick L. Rosno, Rochester, MN (US); Timothy J. Schmerbeck, Mantorville, MN (US); Dereje G. Yilma, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/806,421

(22) Filed: Nov. 8, 2017

Related U.S. Application Data

(63) Continuation of application No. 15/492,677, filed on Apr. 20, 2017.

(51) Int. Cl.
| | |
|---|---|
| H03B 1/00 | (2006.01) |
| H03K 3/00 | (2006.01) |
| H03K 17/08 | (2006.01) |
| H03H 11/30 | (2006.01) |
| H03K 19/0175 | (2006.01) |

(52) U.S. Cl.
CPC ............. *H03K 17/08* (2013.01); *H03H 11/30* (2013.01); *H03K 19/017509* (2013.01)

(58) Field of Classification Search
CPC . H03K 17/08; H03K 19/017509; H03H 11/30

USPC ........ 327/108–112, 427, 434, 437, 379–391, 327/306; 326/81–83, 87
See application file for complete search history.

(56) References Cited

U.S. PATENT DOCUMENTS

| | | |
|---|---|---|
| 4,697,155 A | 9/1987 | Lehning |
| 4,752,699 A | 6/1988 | Cranford, Jr. et al. |
| 6,870,407 B2 | 3/2005 | Lundberg |
| (Continued) | | |

OTHER PUBLICATIONS

"Generation of Higher Number of Voltage Levels by Stacking Inverters of Lower Multilevel Structures With Low Voltage Devices for Drives" Viju Nair R; Arun Rahul S; R. Sudharshan Kaarthik; Abhijit Kshirsagar; K. Gopakumar IEEE ransactions on Power Electronics Year: 2017, vol. 32, Issue: 1, pp. 52-59.

(Continued)

*Primary Examiner* — Thomas Skibinski
(74) *Attorney, Agent, or Firm* — Patterson + Sheridan, LLP

(57) ABSTRACT

Certain aspects of the present disclosure are directed to a circuit for driving a signal at an output node. The circuit generally includes a voltage divider network having a first terminal coupled to the output node. The circuit also includes a first transistor having a gate coupled to a second terminal of the voltage divider network and a plurality of transistors. A gate of each of the plurality of transistors may be coupled to a respective tap node of the voltage divider network, and the plurality of transistors may include a third transistor having a source coupled to a drain of the first transistor. The circuit may also include a second transistor coupled to the first transistor and having a gate coupled to an input node of the circuit.

5 Claims, 5 Drawing Sheets

(56) References Cited

U.S. PATENT DOCUMENTS

| | | |
|---|---|---|
| 7,005,913 B2 | 2/2006 | Diffenderfer |
| 7,880,500 B2 | 2/2011 | Monk |
| 8,030,964 B1 | 10/2011 | Shih et al. |
| 8,330,504 B2 | 12/2012 | Olson |
| 8,339,189 B2 | 12/2012 | Lee |
| 8,847,636 B2 | 9/2014 | Kerr et al. |
| 9,423,815 B2 * | 8/2016 | Mitsuishi et al. |
| 2007/0159373 A1 * | 7/2007 | Peschke .............. H03K 17/102 341/156 |
| 2008/0265950 A1 * | 10/2008 | Sorenson ......... H03K 19/01825 327/108 |
| 2013/0265085 A1 * | 10/2013 | Kerr ................ H03K 19/00315 327/109 |
| 2016/0056822 A1 | 2/2016 | Fifield |
| 2016/0173081 A1 | 6/2016 | Pan et al. |

OTHER PUBLICATIONS

"Method for over-voltage protection circuit for USB devices" Disclosed Anonymously IPCOMM000143790D Dec. 8, 2006.

\* cited by examiner

BIDIRECTIONAL INTERFACE USING THIN OXIDE DEVICES

CROSS-REFERENCE TO RELATED APPLICATIONS

This application is a continuation of co-pending U.S. patent application Ser. No. 15/492,677, filed Apr. 20, 2017. The aforementioned related patent application is herein incorporated by reference in its entirety.

BACKGROUND

As semiconductor technologies progress, smaller feature sizes translate to lower voltage device capabilities. The requirement for high voltage interfaces is going against the scaling progress of the silicon technologies. To support these high voltage interfaces, the silicon technologies offer more robust multi-oxide device types which add process complexity, cost, and degrade the low voltage device performance. Efficient design of high voltage interfaces using high performance thin oxide complementary metal oxide semiconductor (CMOS) devices, such as a 3.3V interface using 1.1V rated oxide breakdown CMOS devices, is important. These high voltage interfaces include Inter-Integrated Circuit ($I^2C$) busses, serial peripheral interface (SPI) busses, low pin count (LPC) buses, adaptive voltage scaling (AVS) busses, as well as other open drain and tristate driver busses, which usually use bidirectional (BIDI) interfaces (e.g., include both driver and receiver).

SUMMARY

Certain aspects of the present disclosure are directed to a driver circuit with protection circuitry against transient voltage spikes.

Certain aspects of the present disclosure provide a method for driving a signal at an output node. The method generally includes selectively coupling a supply node to the output node through a first transistor and a plurality of cascode connected transistors, wherein a drain of the first transistor is coupled to a source of one of the plurality of cascode connected transistors, generating a plurality of voltage divided signals based on a signal at the output node, and providing the voltage divided signals to respective gates of the plurality of cascode connected transistors.

BRIEF DESCRIPTION OF THE DRAWINGS

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Both 3.3V and 2.5V interfaces are common for low cost commercially available legacy electronic parts. For example, the I2C serial interface, commonly used on double data rate type 3 and type 4 (DDR3/4) memory modules, operates at 3.3V and 2.5V respectively. Analog-to-digital converters (ADCs) may only be available with 3.3V or higher bi-directional (BIDI) interfaces. To support these interfaces, native processors need to tolerate high voltages or external bus voltage converters may be inserted between the legacy part and the processor on every interface bit at the card level.

External voltage converters can be expensive and take up valuable card space. To avoid using voltage converter modules, the chip native circuits can be designed to handle high voltage operation in both drive and receive modes. In receive mode, the driver can be designed such that it is partially disabled. This partial shutdown allows the voltages on the cascoded driver field-effect transistors (FETs) to follow the pad voltage and, hence, not create an over-voltage condition on any cascaded driver FET device.

The cascaded driver circuit can absorb high energy voltage reflections from transmission lines and inductive load voltage kickbacks. Pad voltage overshoots/undershoots, reflections due to transmission line impedance mismatches or power transients can also be absorbed. In certain aspects of the present disclosure, these pad transient signals may be divided across the output driver cascoded FET devices, as will be described in more detail herein.

Figure 1:
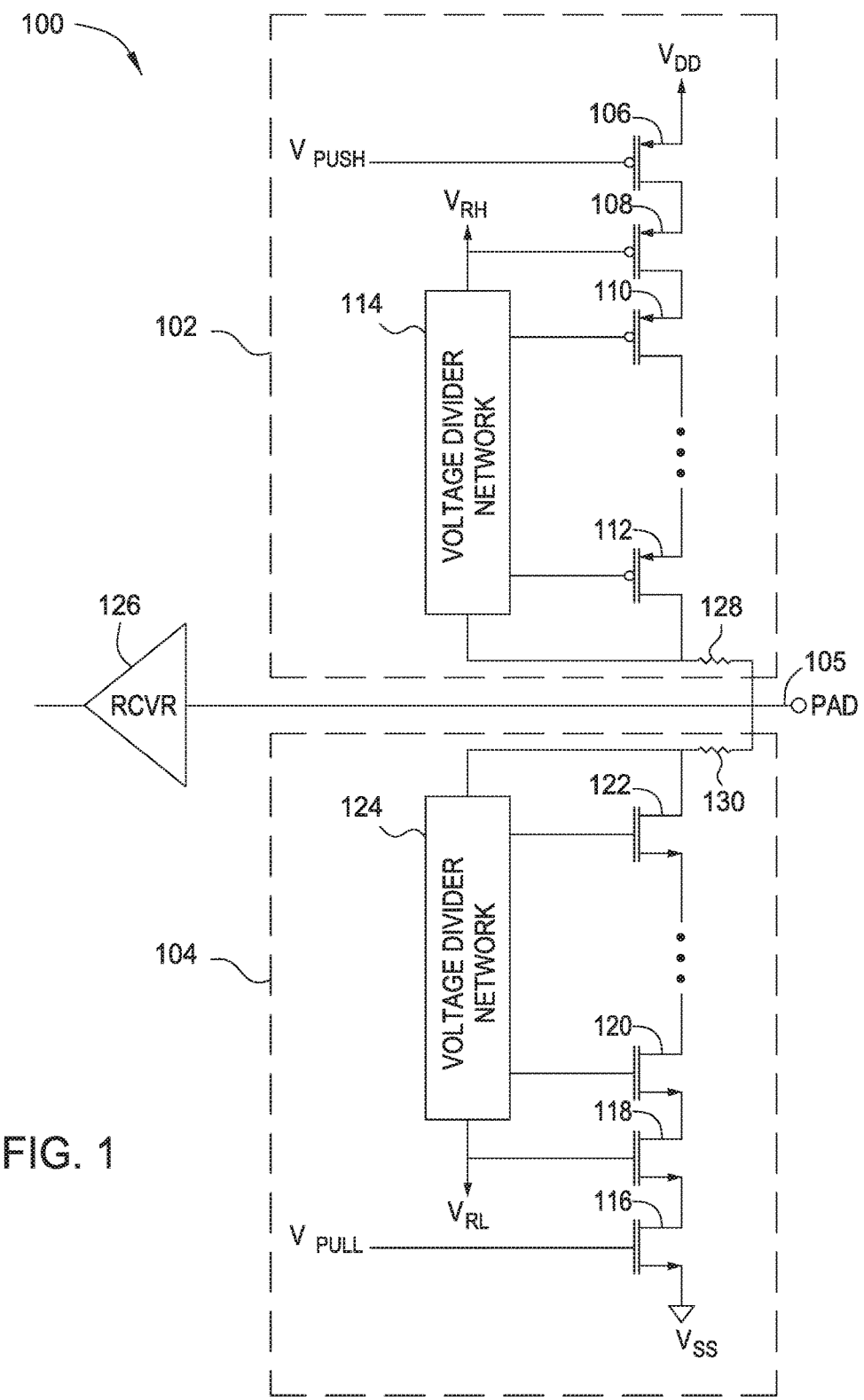
FIG. 1 illustrates an example driver circuit, in accordance with certain aspects of the present disclosure.

FIG. 1 illustrates an example driver circuit 100, in accordance with certain aspects of the present disclosure. The driver circuit 100 includes independent push and pull circuitry 102 and 104 that can be active in a push-pull configuration, or inactive in an open drain configuration. For example, in a push-configuration, the driver circuit 100 sources current from a supply node (e.g., $V_{DD}$) to a pad node 105, and in a pull-configuration, the driver circuit 100 sinks current from the pad node 105 to a reference potential (e.g., electric ground). The push circuitry 102 is implemented with p-channel field-effect transistors (PFET) transistors and the pull circuitry 104 is implemented with n-channel field-effect transistors (NFET) transistors, as illustrated. For example, the push circuitry 102 includes a transistor 106 (e.g., PFET transistor) that is controlled by a push input signal (Vpush).

The transistor 106 is coupled to a pad node 105 through a series of cascode connected transistors configured to protect the driver circuit from transient voltage spikes at the pad node 105. For example, the drain of transistor 106 is coupled to a source of a transistor 108 having a gate coupled to an intermediary voltage node VRH. VRH is a low impedance reference voltage created by a circuit not shown in FIG. 1. Here, the drain of transistor 108 is coupled to a plurality of stacked transistors 110, 112 having gates controlled by a voltage divider network 114. While the driver circuit illustrates two transistors 110 and 112 to facilitate understanding, any number of transistors may be used depending on the oxide breakdown voltage of the transistors and a desired level of protection against transient voltage spikes at pad node 105.

In FIG. 1, a first terminal of the voltage divider network 114 is coupled to the pad node 105 and a second terminal of the voltage divider network is coupled to the intermediary voltage node VRH. The voltage divider network 114 divides the signal (e.g., the normal signal swing as well as any transient voltage spike) at the pad node 105 and provides the divided voltages to gates of transistors 110, 112. A similar circuit topology is implemented for the pull circuitry 104 including another voltage divider network 124 and implemented with NMOS transistors, as illustrated.

To disable the driver circuits 102 and 104, the gate of transistor 106 is driven to VDD, and the gate of transistor 116 is driven to VSS. In this case, the signal at the gates of transistors 110, 112, 120 and 122 follow the signal driven at the PAD node 105 up and down through its signal swing to protect these devices from an overvoltage, which may be caused by excessive magnitude of gate-to-source voltage (VGS), gate-to-drain voltage (VGD), or drain-to-source voltage (VDS). Thus, the voltage divider networks 114 and 124 provide a fractional version of the signal at the pad node 105 to each of the gates of transistors 110, 112, 120 and 122.

As illustrated, the driver circuit 100 is a bidirectional system that can drive a signal onto the pad node 105 for communication to an external receiver (RCVR) (not shown in FIG. 1) and also receive a signal externally driven on the transmission line coupled to the pad node 105. For example, a RCVR 126 may be coupled to the pad node 105 for detecting the received signal. In certain aspects, resistive devices 128 and 130 may be coupled to the pad node 105 for impedance matching to the transmission line. For example, each of the resistive devices 128 and 130 may have a resistance value of 50 ohms, or some equivalent resistance so that the driver impedance matches the transmission line impedance both in driver mode, and also in receiver mode, to protect the circuit from fast high voltage spikes due to transmission line reflections.

In certain aspects, the driver circuit 100 may be for a 3.3V tristate driver design. For example, the voltage rail VDD may be set at 3.3V (e.g., +/−10%), and the reference potential (VSS) may be at 0 volts (e.g., electric ground). In certain aspects, one, some, or all of the transistors of the driver circuit 100 may be thin oxide metal-oxide semiconductor field effect transistors (MOSFETs) with a rated oxide maximum direct-current (DC) usage voltage of 1.155v. However, the topology described herein can be used for other types of transistors such as planar MOSFETs, 3-D or bulk/silicon-on-insulator (SOI) FinFET devices. The topology can also be used for different VDD voltages as well as different oxide breakdown voltages. The limiting factor for the voltage operation of the driver circuit 100 may be source (or drain) to bulk or substrate breakdown voltage, which should be equal to or more than the voltage rail VDD.

Figure 2:
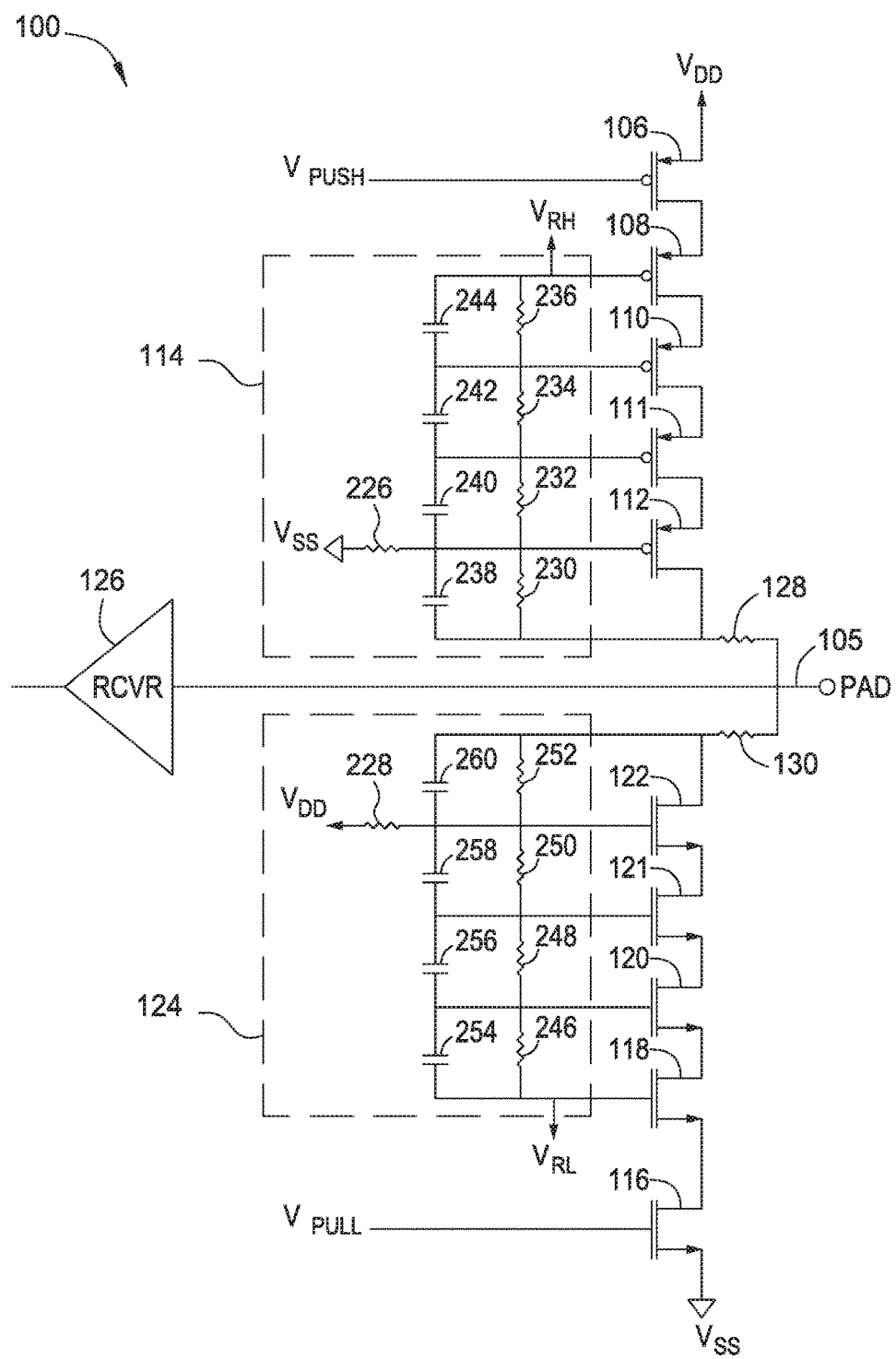
FIG. 2 illustrates the example driver circuit of FIG. 1 with implementation details of voltage divider networks, in accordance with certain aspects of the present disclosure.

FIG. 2 illustrates the example driver circuit 100 of FIG. 1 with implementation details of the voltage divider networks 114 and 124, in accordance with certain aspects of the present disclosure. In this case, the transistor 108 is coupled to three cascode connected transistors 110, 111, and 112 and the transistor 118 is coupled to three cascode connected transistors 120, 121, and 122. As illustrated, the voltage divider network 114 may be implemented as a resistor-capacitor (RC) divider network including a series of resistive devices 230, 232, 234, 236, each coupled in parallel to one of a plurality of capacitors 238, 240, 242, 244. Moreover, the gate of the transistor 112 may be coupled to VSS through a resistive device 226. In certain aspects, the resistance and capacitance values of the RC divider network may not be the same and may be selected based on the supply voltage value of VDD and the oxide breakdown voltage of respective transistors of the driver circuit 100.

In certain aspects, the resistance value of the resistive device 226 may be equal to the equivalent resistance between the intermediary voltage node VRH and the gate of transistor 112. For example, in some cases, resistive devices 232, 234, and 236 may have identical resistance values, and the resistance value of the resistive device 226 may be selected to be the equivalent series resistance of resistive devices 232, 234, and 236 (e.g., three times the resistance of any one of the resistive devices 232, 234, and 236). Similarly, the voltage divider network 124 may be implemented as a resistor-capacitor (RC) divider network including a series of resistive devices 246, 248, 250, 252, each coupled in parallel to one of a plurality of capacitors 254, 256, 258, 260. The gate of the transistor 122 may be coupled to VDD through a resistive device 228.

The resistive devices of the voltage divider network 114 provide a low frequency fixed voltage, plus a feedback voltage from the pad node 105, across the gate of each of the transistors 110, 111, and 112. The low-frequency fixed voltages correspond to the voltage potential VRH-VSS, voltage divided across the tap nodes of the voltage divider network 114 that are coupled to respective gates of the transistors 110, 111, and 112. The capacitors 238, 240, 242, 244 provide an alternating-current (AC) feedback from the pad node 105. For example, a transient voltage spike can be divided via the capacitor network across the gates of the transistors 110, 111, and 112.

To enable the driver circuit 100, the input signals Vpull and Vpush are driven to the gates of transistors 106 and 116. The transistors 108 and 116 have their gates at a fixed reference voltage at the intermediary voltage nodes VRH and VRL, respectively. Thus, the transistors 108 and 118 act to reduce the voltage across the transistors 106 and 116, respectively. The transistors 110, 111, and 112 and the transistors 120, 121, and 122 have their gates driven by tap nodes of a respective fixed resistive low frequency voltage divider network 114, 124, as well as a low frequency resistive and high frequency capacitive feedback signal from the pad node 105, as described above.

Figure 3:
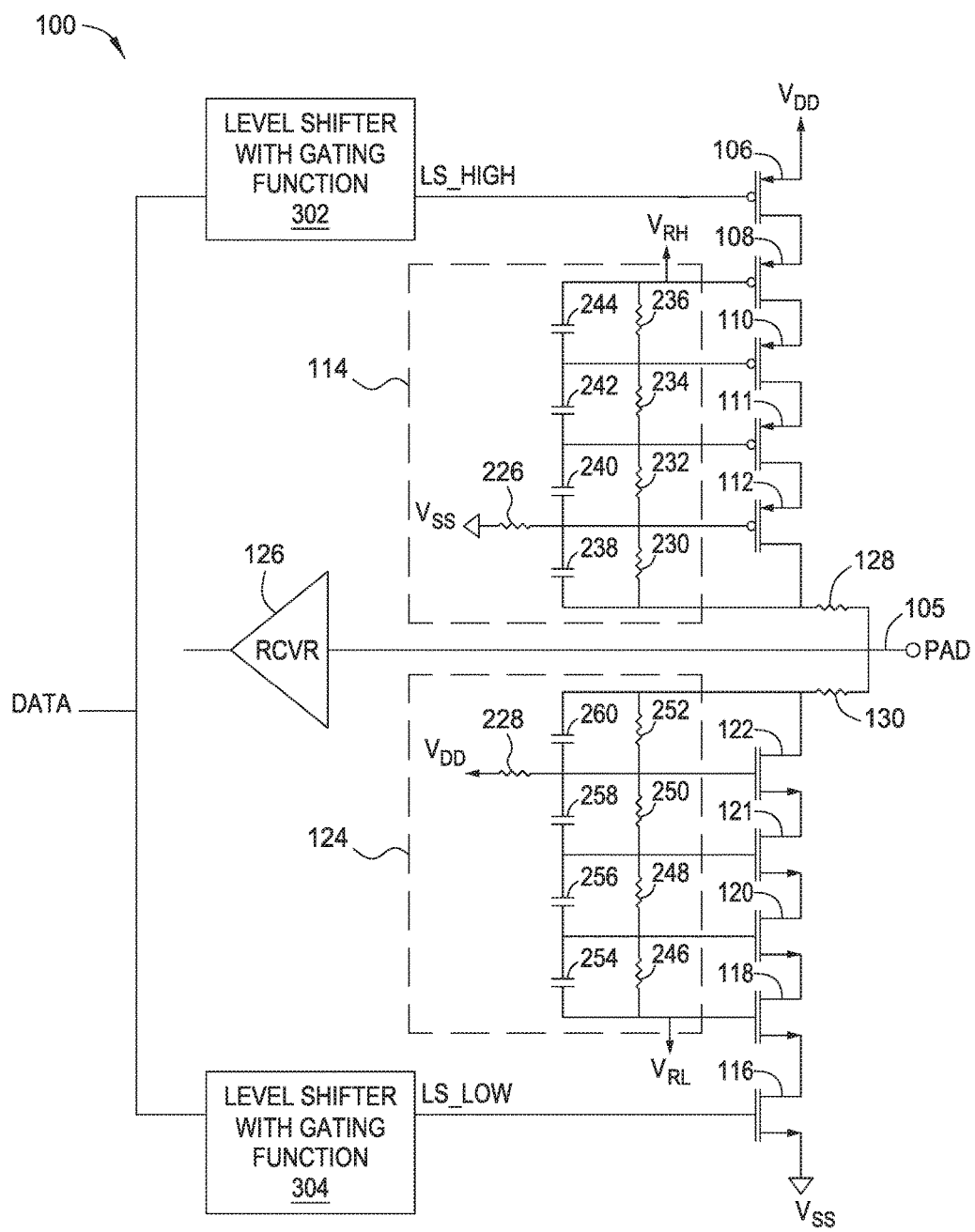
FIG. 3 illustrates the example driver circuit of FIG. 2 including level shifter circuits, in accordance with certain aspects of the present disclosure.

FIG. 3 illustrates the example driver circuit 100 of FIG. 2 including level shifter circuits 302 and 304, in accordance with certain aspects of the present disclosure. In certain aspects, an input data signal may be based off a low voltage logic supply level. Therefore, level shifter circuits 302 and 304 may be used to translate the voltage level of the data signal to properly drive the transistors 106 and 116. In certain aspects, the level shifters 302 and 304 may be implemented with a gating function to drive respective transistors 106 and 116 through individually controlled gating logic to maintain the open-drain capability. For example, the level shifter 302 may generate an L_S HIGH signal to drive the transistor 106, and the level shifter 304 may generate an LS_LOW signal to drive the transistor 116.

In certain aspects, the voltage divider networks 114 and 124 may be implemented with high impedance by using relatively high resistance values for resistive devices 226, 230, 232, 234, 236, 228, 246, 248, 250, and 252, allowing for relatively low driver leakage when the driver is disabled in tristate mode. The sizing of the capacitors of the voltage divider networks 114 and 124 is also important for supplying the driver circuit 100 with its high frequency operation. The voltage divider networks 114 and 124 work off the voltage at the pad node 105, and therefore, the voltage at the pad node 105 drives the gates of the transistors 110, 111, 112 of the push circuitry 102 as shown in FIG. 1 and the transistors 120, 121, and 122 of the pull circuitry 104 as shown in FIG. 1.

In certain aspects, the capacitors of the voltage divider networks 114 and 124 are sized such that they dominate the capacitive dividing operation of the voltage divider networks 114 and 124. In other words, the capacitance of the capacitors 238, 240, 242, and 244 is large as compared to the gate capacitance and any other parasitic capacitance of the transistors 108, 110, 111, and 112. Similarly, the capacitance of the capacitors 254, 256, 258, and 260 is large as compared to the gate capacitance and any other parasitic capacitance of the transistors 118, 120, 121, and 122. Therefore, the capacitors of voltage divider networks 114 and 124 are in effect a high-frequency bypass such that when a high energy and high voltage spike is driven into the circuit at the pad node 105, that voltage spike is voltage divided across respective transistors 110, 111, and 112 of the voltage divider network 114 and transistors 120, 121, and 122 of voltage divider network 124. By distributing the voltage spike across multiple transistors, the entirety of the voltage spike is not applied to any one transistor, preventing the voltage across any one transistor from exceeding the transistor's oxide breakdown voltage. Moreover, the capacitance of the capacitors of the voltage divider networks 114 and 124 should be selected such that such a voltage spike is within the bandwidth of the capacitor divider. Thus, the driver circuit 100 is configured to protect the output driver transistors 106 and 116 from the transmission line or inductive reflections, or any other source of a pad voltage transient. In certain aspects, at least one of the transistors 106 or 116 may be implemented with multiple cascode connected transistors.

Figure 4:
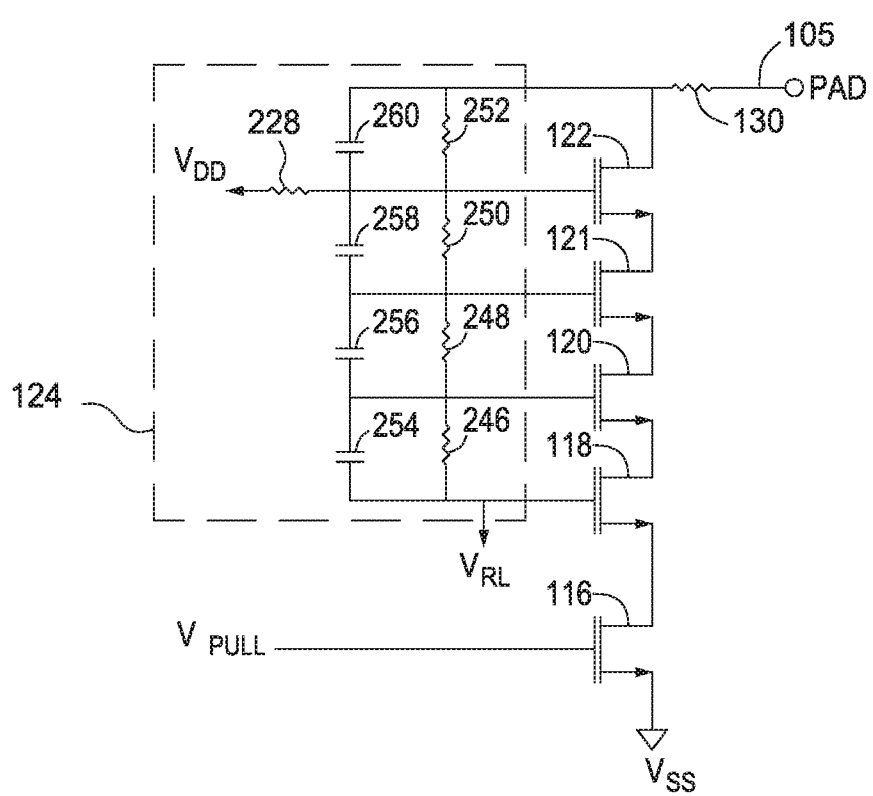
FIG. 4 illustrates the example driver circuit of FIG. 2 in an open drain configuration, in accordance with certain aspects of the present disclosure.

FIG. 4 illustrates the example driver circuit 100 in an open drain configuration, in accordance with certain aspects of the present disclosure. The push circuitry 102 as shown in FIG. 1 and the pull circuitry 104 as shown in FIG. 1 of the driver circuit 100 can operate independently. Therefore, for open drain operation, the transistors of the push circuitry 102 can be disabled, or can be removed from the circuit via removal of a jumper wire. In this configuration, the driver circuit 100 is ready to be used for open drain NFET operation. Similarly, the circuit driver can be configured in an open drain PFET operation, where the NFET devices of the pull circuitry 104 are deactivated or removed. Thus, the design of the driver circuit 100 can be logically controlled or switched from a push-pull tristate driver to an open drain (NFET or PFET) driver.

While the examples provided herein have shown a driver circuit with a five transistor stack of NFETS and PFETS to facilitate understanding, any number of transistors can be used. For example, while the push circuitry 102 is implemented with a stack of five transistors and four resistor-capacitor stack voltage divider network, the push circuitry 102 can be implemented with a stack of N resistors, and N−1 stack of resistor-capacitor stack voltage divider network.

Aspects of the present disclosure provide a driver circuit with several advantages. For example, the driver circuit 100 can be configured or programmed to be an open drain only design for communication interfaces such as I2C or fully tristate driver design. The biasing of driver circuit 100 allows for a configuration change by removal of a jumper wire, or by logically disabling the PFET or NFET stacks as described above. Thus, the circuit driver 100 provides one design that support open drain or tristate based on logic controls. The driver circuit 100 can also handle multiple voltage rails (e.g., 1.8 volt, 2.5 volt, 3.3 volt) without having to change circuit topology.

The driver circuit 100 is also robust to high energy high voltage spikes coming back at the driver from transmission line reflections, inductive kickback, or power supply transients. The driver circuit 100 can be configured for fairly high DC impedance (e.g., about 100 k ohm or more for relatively low driver leakage in tristate mode). Since the high frequency performance is determined by the capacitive feedback network, as opposed to the resistive network, the voltage divider networks can have high impedance for low leakage without overly sacrificing speed and performance. The driver circuit 100 is easily expandable to higher voltage rails by increasing the number of transistors in the transistor stacks of each of the push and pull circuitry 102 and 104.

The voltage divider networks 114 and 124 also limit the output voltage rise and fall time, and therefore, limit the driven output undershoot and overshoot levels. The driver circuit 100 can handle large overshoots/undershoots from an external driver. Tolerance for voltage overshoots and undershoots is set based on the amount that the voltage magnitude of intermediary voltage node VRL is above VSS and the amount that the voltage magnitude of intermediary voltage node VRH is below VDD. This voltage rail difference allows a greater amount of overshoot or undershoot at the pad node before exceeding the oxide breakdown voltage of the CMOS output stacked/cascoded devices (e.g., transistors 110, 111, 112, 120, 121, and 122). For example, the magnitude of VRL may be set at 0.8V above VSS and VRH may be set of 0.8V below VDD, and if the oxide breakdown is 1.155V, the driver circuit 100 would be able to handle roughly 1.155-0.8, or about 355 mV overshoot/undershoot. However, the driver circuit 100 can potentially handle larger overshoots and undershoots because the oxide breakdown for a particular technology depends on several other factors such as the time duration and waveform of the overshoots and undershoots and the number of events in the lifetime of the overshoots and undershoots. But as a rough figure of merit, the DC overshoot and undershoot tolerance may be around 355 mV in this example. The capacitive division of transient voltages at the pad node 105 also divides transients due to power supply on/off sequencing.

The driver circuit 100 is effectively independent of the design of the receiver 126. The receiver 126 may be connected directly to the pad node 105, as illustrated. The receiver 126 can use a programmable resistor divider network from the pad node to divide the pad voltage swing down to acceptable levels for the technology devices being used. A similar capacitive voltage divider across the input resistive divider can be used to attenuate pad voltage transients for the receiver 126.

In certain aspects, a voltage regulator may be used to provide the voltages for the VRH and VRL intermediary supply nodes. The voltage regulator that supplies the supply voltages for the VRH node may be designed to tolerate the high DC voltages involved with the limitation of low breakdown voltage thin oxide devices. Since the driver circuit 100 may have a low current draw from the voltage regulator, the voltage regulator can be implemented by using multiple stacked or cascoded lower voltage regulators so that a single regulator does not see more than the thin oxide breakdown voltage across it. For example, three 0.8V voltage regulators may be stacked to provide a 2.4V reference.

The voltage regulator can also be implemented using passive elements that may have higher breakdown voltages such as metal-to-metal capacitors, series stacked/cascoded low voltage capacitors, metal layer or metal film resistors. Examples of these regulators could be a simple resistor divider from the VDD supply with decoupling capacitors placed at the regulator output, or even a resistor divider network programmed by MOSFET switches that vary the regulator output voltage, based on logic control signals. A decoupling capacitor may still be used at the regulator variable output. The MOSFET switches could also be stacked or cascoded to be able to handle higher voltages. Also NFET switches could switch resistor connections within the breakdown voltage of VSS and PFET switches could switch resistor connections within the breakdown voltage of VDD. In some cases, capacitive voltage dividers could be used to supply the regulated voltage.

Figure 5:
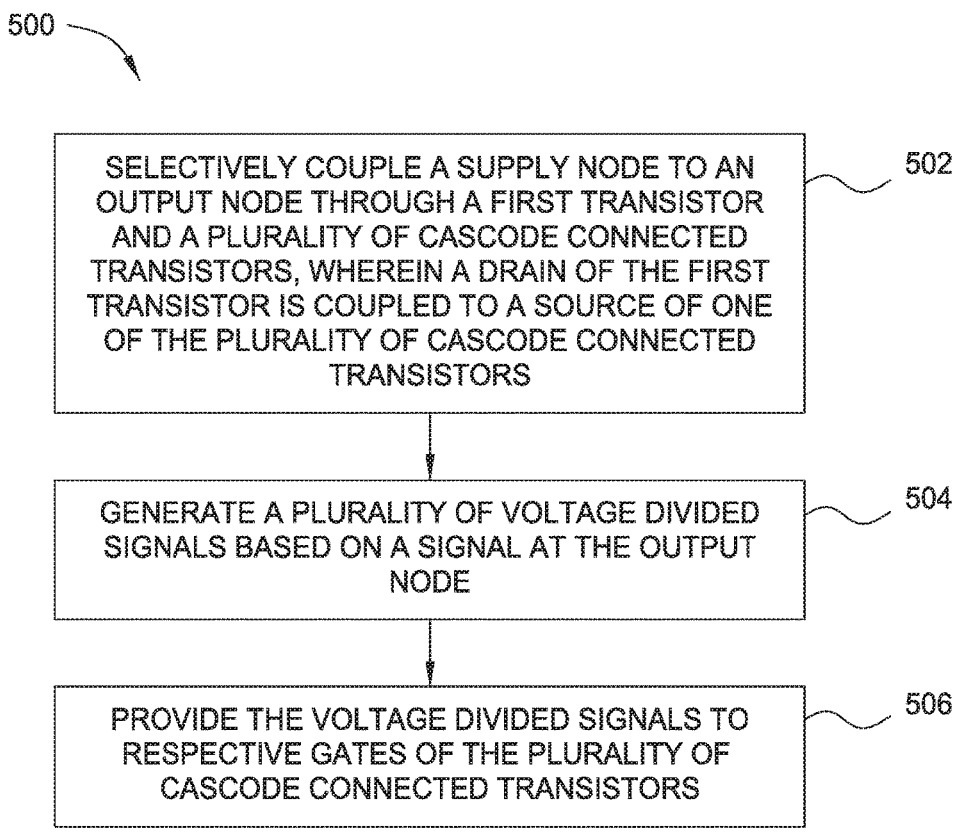
FIG. 5 is a flow diagram illustrating example operations for driving a signal at an output node, in accordance with certain aspects of the present disclosure.

FIG. 5 is a flow diagram illustrating example operations 500 for driving a signal at an output node, in accordance with certain aspects of the present disclosure. The operations 500 may be performed by a driving circuit, such as the driving circuit 100 of FIGS. 1-4.

The operations 500 may begin, at block 502, by selectively coupling a supply node (e.g., VDD) to the output node through a first transistor (e.g., transistor 106) and a plurality of cascode connected transistors (e.g., transistors 110, 111, 112). In certain aspects, a drain of the first transistor is coupled to a source of one of the plurality of cascode connected transistors. At block 504, the driver circuit may generate a plurality of voltage divided signals based on a signal at the output node, and at block 506, provide the voltage divided signals to respective gates of the plurality of cascode connected transistors.

In certain aspects, the operations 500 may also include impedance matching (e.g., via resistive device 128) to a transmission line coupled to the output node. In certain aspects, generating the plurality of voltage divided signals is performed via a voltage divider network (e.g., voltage divider network 114) having a first terminal coupled to a gate of the first transistor and a second terminal coupled to the output node. In this case, the voltage divider network may include a plurality of resistive devices (e.g., resistive devices 230, 232, 234, and 236), each of the resistive devices coupled in parallel to a capacitor (e.g., capacitors 238, 240, 242, 244).

In certain aspects, the operations 500 also include selectively coupling another supply node (e.g., VSS) to the output node through a second transistor (e.g., transistors 118) and another plurality of cascode connected transistors (e.g., transistors 120, 121, and 122). For example, a drain of the second transistor may be coupled to a source of one of the other plurality of cascode connected transistors. In this case, another plurality of voltage divided signals may be generated based on the signal at the output node, and provided to a respective gate of the other plurality of cascode connected transistors. The operations 500 may also include configuring the driver circuit in an open drain configuration by disabling the selectively coupling operation at 502.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

While the foregoing is directed to embodiments of the present invention, other and further embodiments of the invention may be devised without departing from the basic scope thereof, and the scope thereof is determined by the claims that follow.

What is claimed is:

1. A method for driving a signal at an output node, comprising:
    selectively coupling a supply node to the output node through a first transistor and a plurality of cascode connected transistors, wherein a drain of the first transistor is coupled to a source of one of the plurality of cascode connected transistors, the plurality of cascode connected transistors comprising a second transistor coupled to the output node;
    generating, via a voltage divider network, a plurality of voltage divided signals based on a signal at the output node, wherein the voltage divider network comprises a first terminal coupled to the output node and a second terminal coupled to a first voltage supply, wherein the voltage divider network comprises a first resistive device coupled between a drain and a gate of the second transistor, and a second resistive device coupled between a gate of the second transistor and a second voltage supply that is different than the first voltage supply; and
    providing the voltage divided signals to respective gates of the plurality of cascode connected transistors.

2. The method of claim 1, further comprising impedance matching to a transmission line coupled to the output node.

3. The method of claim 1, wherein the voltage divider network comprises a plurality of resistive devices, each of the resistive devices coupled in parallel to a capacitor.

4. The method of claim 1, further comprising:
    selectively coupling another supply node to the output node through a second transistor and another plurality of cascode connected transistors, wherein a drain of the second transistor is coupled to a source of one of the other plurality of cascode connected transistors;
    generating another plurality of voltage divided signals based on the signal at the output node; and
    providing the voltage divided signals to a respective gate of the other plurality of cascode connected transistors.

5. The method of claim 4, further comprising disabling the selectively coupling the other supply node to the output node.

* * * * *